Figure 1B:
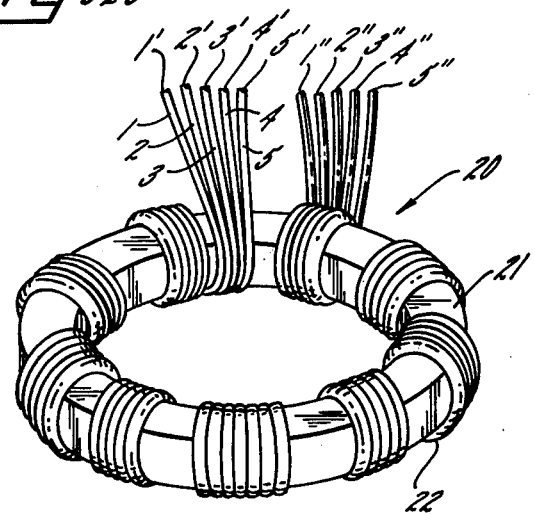

United States Patent [19]

Borys, Jr.

[11] 4,031,540

[45] June 21, 1977

[54] IMPEDANCE MATCHING DEVICE

[75] Inventor: Emil G. Borys, Jr., Rockford, Ill.

[73] Assignee: Hydrometals, Inc., Chicago, Ill.

[22] Filed: Feb. 17, 1976

[21] Appl. No.: 658,288

[52] U.S. Cl. .................................. 343/860; 333/8
[51] Int. Cl.² ........................................ H01Q 1/50
[58] Field of Search ............. 333/6, 8, 32; 343/858, 343/860, 865

[56] References Cited

UNITED STATES PATENTS

| | | | |
|---|---|---|---|
| 2,700,129 | 1/1955 | Guanella | 333/8 |
| 2,788,495 | 4/1957 | Hylas et al. | 333/8 |
| 3,534,371 | 10/1970 | Seavey | 343/792 |

Primary Examiner—Eli Lieberman
Attorney, Agent, or Firm—Leydig, Voit, Osann, Mayer & Holt, Ltd.

[57] ABSTRACT

An impedance matching device for matching the impedance of a pair of antennas to that of a common source. Impedance matching is achieved by a bifilar transformer having a plurality of mutually coupled windings, such windings being connected in series parallel relationship so as to provide a pair of parallel connected branches having a common leg, the antennas being connected to the respective branches so that each antenna sees the full reflected impedance of the source.

6 Claims, 2 Drawing Figures

IMPEDANCE MATCHING DEVICE

This invention relates to radio transmission and reception, and more particularly to means for matching the impedance of radio antennas to the source impedance of the transmitter, receiver or transceiver.

It is well known that in radio transmission the impedance of the radio (transmitter, receiver or transceiver, hereinafter source) should be closely matched to that of the antenna. For example, if a transceiver having a 50 ohm output impedance is used, an antenna of nominal 50 ohms will be provided, coupled to the transceiver by a 50 ohm transmission line. Problems arise in certain applications because of the desirability of using two antennas with a single source. This situation is common, for example, in automotive radio applications, where two antennas are often used in order to lower the vertical bandwidth of the radiated beam. As a further example, truckers often utilize an antenna on either side of the cab so as to minimize the interference provided by the cab itself, providing a radiated beam more omni-directional in character.

Impedance matching problems arise in coupling a pair of antennas to a single source. If the antennas are simply coupled in parallel at some common point and then connected from that common point to the source, the impedance of the antennas as seen by the source is the parallel combination. Thus, if a 50 ohm source is used with a pair of 50 ohm antennas, the source actually "sees" the parallel combination of the two antennas or 25 ohms. It will be apparent that this provides a two to one impedance mismatch, decreasing the power transfer ratio from source to load and setting up potentially harmful reflections.

Various means have been proposed for curing this impedance mismatch problem, and have operated with varying degrees of success. For example, it has been proposed to couple the respective antennas to a common junction point via individual quarter wave transformers, thereby to achieve an impedance match. Following this approach, if a pair of 50 ohm antennas are used with a 50 ohm source, the antennas are coupled to a common junction point via 75 ohm transmission line having a length equal to one quarter wavelength of the operating frequency. While this approach is entirely workable, it suffers from the defect of a limited range of operating frequency in that the physical length of the quarter wave sections are fixed, thereby fixing the center frequency of impedance match. Additionally, this approach often requires extra cable lengths to achieve the quarter wave sections, it being realized that a quarter wavelength at 10 megacylces, for example, is approximately 25 feet.

Reactive components coupled between the respective antennas and the source have been used for impedance matching a pair of antennas to a single source. However, this approach very often requires variable elements in the circuit, such as a variable capacitor to tune for the proper impedance match. Additionally, this system also suffers from a limited operating frequency range.

In view of the foregoing, it is a general aim of the present invention to provide an impedance matching device for matching the impedance of a plurality of antennas to a single source, such device being simple and inexpensive to construct, but possessing a wide operating frequency range. In that regard, it is an object of the present invention to provide an impedance matching device utilizing a bifilar transformer and the close coupling achieved therewith to reflect the impedance of a single source into separate parallel branches, each branch providing a connecting point for an individual antenna. Moreover, it is an object to provide such an impedance matching device requiring no tuned or adjustable components in the circuit.

Figure 2A:
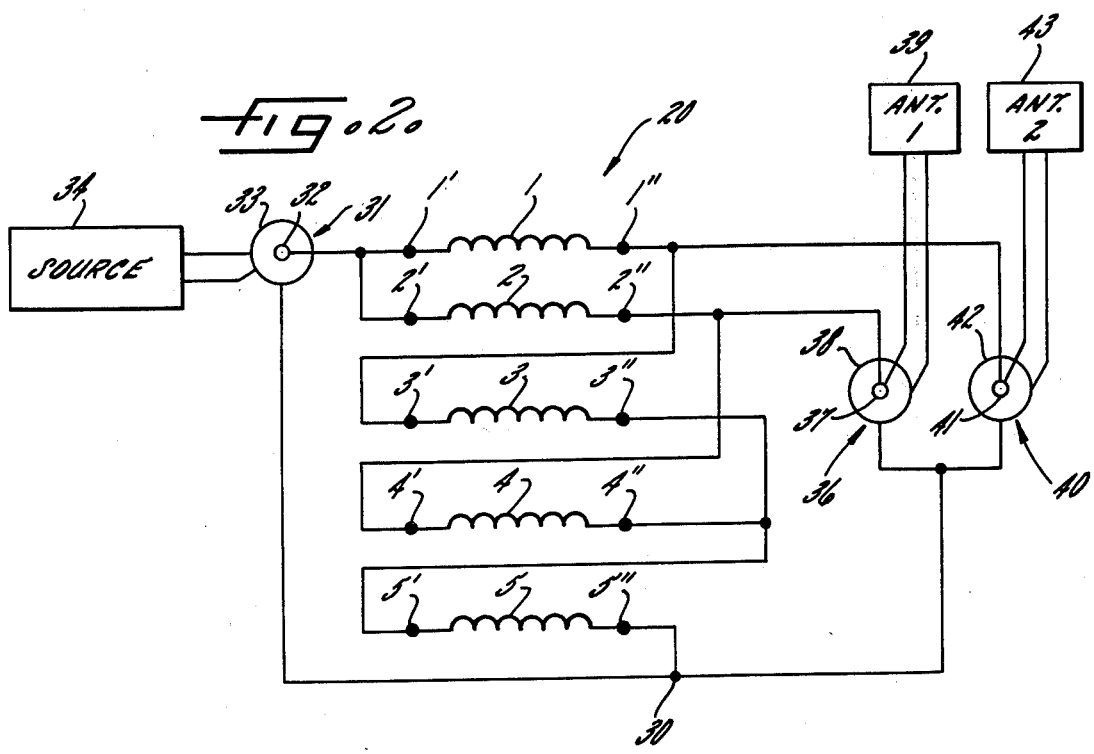

A further object according to the present invention is to provide an impedance matching device for matching a pair of antennas to a single source, such impedance matching device being relatively insensitive to the lengths of cable connecting the antennas to the device itself. Other objects and advantages will become apparent from the following detailed description when taken in conjunction with the drawings in which:

FIG. 1 is a perspective view showing an impedance matching device exemplifying the present invention; and FIG. 2 is a schematic diagram illustrating the interconnection of the impedance matching device of FIG. 1. While the invention will be described in connection with a preferred embodiment, there is no intent to limit it to that embodiment. On the contrary, the intent is to cover all alternatives, modifications and equivalents included within the spirit and scope of the invention as defined by the appended claims.

Turning now to the drawings, FIG. 1 shows, somewhat schematically, an impedance matching device exemplifying the present invention. The impedance matching device, generally indicated at 20, comprises a toroidal core 21 having a plurality of windings generally indicated at 22 wrapped thereon. It is seen that the windings are arranged in side by side configuration and wound in the same direction, forming a bifilar transformer. Because of the magnetic properties of the core, to be discussed below, and the bifilar windings, the coupling between the various windings is near unity. As a result, the transformer acts much like an ideal transformer, transforming any impedance imposed on one or more of the windings into an equal reflected impedance in the other coupled windings.

In the embodiment shown in FIG. 1, five windings 1 are wrapped on the core 21 thereby to form a bifilar transformer. For simplicity of illustration, interconnection between the ends of the windings e.g. 1' and 1" of winding 1 are not illustrated. However, these interconnections are shown in schematic fashion in the circuit diagram of FIG. 2.

As shown in FIG. 2, the windings are connected in series parallel configuration including two parallel connected branches and a common series leg. A first parallel branch is formed of the series connection of winding 1 and 3, terminal 1" of winding 1 being connected to terminal 3' of winding 3. Similarly, a second parallel branch is formed of the series connection of windings 2 and 4, terminal 2" of winding 2 being connected to terminal 4' of winding 4. The branches are connected in parallel by connecting terminals 1' and 2', and by forming a similar connection between terminals 3" and 4". The common series leg is formed of winding 5, terminal 5' being connected to the junction of terminals 3" and 4". The remaining terminal of winding 5, terminal 5" is coupled to a common junction 30. It should be noted that the common junction 30 is referred to for ease of understanding and need not necessarily connote any connection to ground or the like.

In accordance with the invention means are provided for connecting a source (e.g. transmitter, receiver or transceiver) across the series parallel combination so as to reflect the impedance of the source individually into each of the parallel branches. To that end, a connector 31 is provided having an inner conductor 32 connected to the junction of terminals 1' and 2' and an outer conductor 33 connected to the common junction 30. Connection between the impedance matching device and the source, schematically illustrated at 34, may be made by an appropriate plug and a length of transmission line.

Further in practicing the invention, means are provided for connecting each of two antennas to respective ones of the parallel branches so that each antenna individually sees the reflected impedance of the source 34. A connector 36 is provided having a center conductor 37 connected to the junction formed of terminals 2'' and 3' in the first parallel branch, and having an outer conductor 38 connected to the common junction 30. A first antenna schematically illustrated at 39 may be connected to the connector 36 by an appropriate plug and length of coaxial cable. Similarly, a connector 40 is provided having an inner conductor 41 connected to the junction of terminals 1'' and 3' in the second parallel branch and an outer conductor 42 coupled to the common junction 30. A second antenna 43 may be coupled by a coaxial cable and suitable plug to the connector 40.

By virtue of the connections detailed above, each of the antennas is coupled across a portion of the associated parallel branch and the common series leg. Therefore, the impedance of each antenna is reflected into the impedance matching device, being split between the individual parallel and common series legs, with a fraction thereof being reflected in the associated parallel leg (3 or 4) and the remainder in the common series leg. 5. Because of the close coupling of the windings, the impedance is also reflected into the additional windings in the parallel legs (1 or 3) so that the total impedance of each series leg is effectively twice the fractional impedance reflected in the winding 3 or 4. The source, being coupled across the entire series parallel combination, sees an effective impedance equal to the parallel combination of the two parallel legs in series with the common leg. As a result, the doubled impedance of each of the parallel legs is halved and added to the remainder impendance so that the source sees effectively the full impedance of each of the antennas.

Stated differently, the source , being connected across the series parallel combination reflects the impedance thereof into each parallel branch. Because the antennas are coupled to separate parallel branches, each of them sees the full impedance of the source. As a result, if each of the antennas is of, for example, nominal 50 ohm impedance and the source is also of nominal 50 ohm impedance, a total impedance match will be achieved.

By takng appropriate measures, it is also possible to couple a source of a first nominal impedance to antennas of a second different nominal impedance. For example, a sixth winding may be serially coupled with winding 5 in the common leg, and the source and respective antennas connected across appropriate portions of the parallel and common legs to achieve the necessary impedance match.

The physical configuration of the core 21 may take the form of a commercially available toroid of ferromagnetic material. Such commercially available cores are characterized as Q1 through Q4 depending on their permeability and therefore their useful operating frequency range. For example, a Q1 core is generally usable to about 10 megahertz, Q2 from 10 to 30 megahertz, Q3 from 30 to 150 megahertz and Q4 for even higher frequencies. Utilizing these commercially available cores, an impedance matching device for use in the frequency range around 5 megahertz may be formed of six turns of the multiple windings on a Q1 core. Operation in the range around 27 megahertz may be achieved by five to six turns on a Q2 core. Operation around 27 megahertz may also be achieved with a Q1 core and two to three turns, but the losses in this case will be higher than the embodiment using a Q2 core.

The size of the wire wound on the toroidal core is determined mainly by the power handling capability desired of the impedance matching device, and has little effect on the other characteristics, such as operating frequency. Stated simply, wire should be selected of sufficient current carrying capability to handle the highest power desired. With regard to selection of the core and number of turns, lower frequency operation generally requires higher permeability and/or more turns. As frequency increases, the number of turns should be decreased and/or a core of lower permeability should be selected.

In the embodiment illustrated in FIG. 1, the windings are arranged in side by side configuration, all lying directly on the core. However, in certain circumstances it may be desirable to twist certain of the windings together. As one practical example, the bifilar transformer may be configured with windings 1 and 2 being a twisted pair, windings 3 or 4 being another twisted pair, the two twisted pairs and winding 5 being wound in side by side configuration on the core.

One of the advantages of the invention is a relatively wide range of operating frequencies, typically at least three octaves. Further, this wide range is achieved without the need for retuning the impedance matching device, no adjustable elements being provided.

It wil now be apparent that what has been provided is an improved impedance matching device for matching a pair of antennas to a single source. The impedance match is maintained over a wide operating frequency range. Due to the close coupling achieved by the bifilar toroidal configuration, the impedance match is generally maintained in the range between 1.1 to 1. The cables joining the respective antennas to the impedance matching device and the device to the source may be of any desired length, independent of the wavelength being transmitted. Finally, the impedance matcher requires no frequency adjustment, being configured to operate over the desired frequency range without the necessity for tuning or the like.

I claim as my invention:

1. An impedance matching device for matching the impedances of a pair of antennas to a single source, said device comprising a bifilar transformer having a toroidal core and five mutually coupled windings thereon, first and second of said windings being connected in series in a first branch, third and fourth of said windings being connected in series in a second branch, said first and second branches being connected in parallel, said fifth winding being connected between said parallel combination and a common connection, means providing a connecting point for a first antenna from the junction between said first and second windings and said common point, means providing a connecting point for said second antenna from the junction between said third and fourth windings and said common point, and means providing a connecting point for said source across said series parallel combination whereby the impedances of said antennas are matched to the impedance of said source.

2. The impedance matching device as set forth in claim 1 wherein antennas having nominal impedances of 50 ohms are connected to the first and second antenna connecting points, the impedance looking into the source connecting point being a nominal 50 ohms.

3. The impedance matching device as set forth in claim 1 wherein said second and fifth windings transform the impedance of said first antenna into a fractional impedance reflected in said second winding and the remainder in said fifth winding, the fourth and fifth windings transforming the impedance of said second antenna into a fractional impedance in said fourth winding and the remainder in said fifth winding, said first and third windings serving to double the impedances in the respective branches, whereby the impedance looking into the impedance matching device from the source connecting point is the resultant of the doubled parallel fractional impedances in series with the remainder impedance.

4. The impedance matching device as set forth in claim 1 wherein the source is a transmitter.

5. The impedance matching device as set forth in claim 1 wherein the source is a receiver.

6. The impedance matching device as set forth in claim 1 wherein the source is a transceiver.

* * * * *